United States Patent
Arsigny et al.

(10) Patent No.: US 8,195,004 B2
(45) Date of Patent: Jun. 5, 2012

(54) DEVICE FOR PROCESSING RAW IMAGES OR TENSOR IMAGES

(75) Inventors: Vincent Arsigny, Rouen (FR); Xavier Pennec, Antibes (FR); Pierre Fillard, Valbonne (FR); Nicolas Ayache, Nice (FR)

(73) Assignee: Inria Institut National de Recherche en Informatique et en Automatique, Le Chesnav Cedex (FR)

( * ) Notice: Subject to any disclaimer, the term of this patent is extended or adjusted under 35 U.S.C. 154(b) by 1168 days.

(21) Appl. No.: 11/910,816

(22) PCT Filed: Apr. 7, 2006

(86) PCT No.: PCT/FR2006/000774
§ 371 (c)(1),
(2), (4) Date: Jan. 25, 2008

(87) PCT Pub. No.: WO2006/106242
PCT Pub. Date: Oct. 12, 2006

(65) Prior Publication Data
US 2008/0170802 A1 Jul. 17, 2008

(30) Foreign Application Priority Data
Apr. 7, 2005 (FR) .................................. 05 03483

(51) Int. Cl.
*G06K 9/36* (2006.01)
(52) U.S. Cl. ........................................................ 382/276
(58) Field of Classification Search .......... 382/276–302, 382/128–131
See application file for complete search history.

(56) References Cited

U.S. PATENT DOCUMENTS 7,039,252 B2 * 5/2006 Ludwig ........................ 382/280
7,630,530 B2 * 12/2009 McGraw et al. ............. 382/128

OTHER PUBLICATIONS

Fillard, "Un Cadre Riemannien pour l'Imagerie du Tenseur," INRIA—Rapport De Stage De Master Optique-Image-Vision, XP002358557 (Aug. 24, 2004).
Pennec et al., "A Riemannian Framework for Tensor Computing,", INRIA Technical Report 5255, XP002358558 (Jul. 2004).
Fletcher et al., "Principal Geodesic Analysis on Symmetric Spaces: Statistics of Diffusion Tensors," CVAMIA and MMBIA Workshops on Computer Vision Approaches to Medical Image Analysis—LNCS 3117, pp. 87-98, XP002358553 (May 15, 2004).
Le Bihan et al., "Diffusion Tensor Imaging: Concepts and Applications," Journal of Magnetic Resonance Imaging, vol. 13, pp. 534-546, XP002358554, (2001).
Lenglet et al., "Statistics on Multivariate Normal Distributions: A Geometric Approach and its Application to Diffusion Tensor MRI," Technical Report, INRIA (Jun. 2004).

(Continued)

*Primary Examiner* — Ishrat I Sherali
(74) *Attorney, Agent, or Firm* — Greenblum & Bernstein, P.L.C.

(57) ABSTRACT

A device (D) is dedicated to the processing of data constituting initial tensor images, each tensor being a real symmetric and positive definite matrix representing an elementary part of a received tensor image. This device (D) comprises, on the one hand, a first calculating module (MC1) capable of performing a first selected, bijective and defined function of $R^{*+}$ in R, and being associated with a selected metric definition, this first function allowing a second reciprocal function, and on the other, comprises a first processing module (MT1) provided for: i) constituting a first representation of a received tensor image; ii) calling the first calculating module (MC1) for applying the first function to a selected part of the first representation whereby obtaining a transformed part, and; iii) constituting, from the transformed part, a second representation of the tensor images ready to be processed.

30 Claims, 7 Drawing Sheets

OTHER PUBLICATIONS

C. Lenglet et al., "Inferring White Matter Geometry from Diffusion Tensor MRI: Application to Connectivity Mapping", In T. Pajdla & Matas, editors, Proc. of the 8th European Conference on Computer Vision, LNCS, Springer, May 11-14, 2004, pp. 127-140.

E. Özarslan et al., "Generalized Diffusion Tensor Imaging and Analytical Relationships Between Diffusion Tensor Imaging and High Angular Resolution Diffusion Imaging", Magnetique Resonance in Medicine, vol. 50, 2003, pp. 955-965.

C. Poupon et al., "Regularization of Diffusion-Based Direction Maps for the Tracking of Brain White Matter Fascicles", Neuroimage, vol. 12, No. 2, Aug. 2000, pp. 184-195.

D. Tschumperlé et al., "Diffusion Tensor Regularization with Constraints Preservation", In Conference on Computer Vision and Pattern Recognition (CVPR), vol. 1, Kauai, Hawaii, Dec. 2001, pp. 948-953.

Z. Wang et al., "A Constrained Variational Principle for Direct Estimation and Smoothing of the Diffusion Tensor Field From Complex DWI", IEEE TMI, vol. 23, No. 8, 2004, pp. 930-939.

C.-F. Westin et al., "Processing and Visualization for Diffusion Tensor MRI", Medical Image Analysis, vol. 6, 2002, pp. 93-108.

B. Mohammadi et al., "Delaunay Mesh Generation Governed by Metric Specifications Part II: Applications", Finite Elements in Analysis and Design, No. 25, 1997, pp. 85-109.

Frédéric Alauzet, "Adaptation de maillage anisotrope en trois dimensions: Application aux simulations instationnaires en Mécanique des fluides", PhD Thésis, Montpellier 2, Oct. 2003.

C. Feddem et al., "Curvature-Driven PDE Methods for Matrix-Valued Images", Technical Report 104, Department of Mechematics, Saarland University, Saarbrücken, Germany, Apr. 2004.

P. Thomas Fletcher et al., "Principal Geodesic Analysis for the Study of Nonlinear Statistics of Shape", IEEE Trans. Med. Imaging, vol. 23, No. 8, 2004, pp. 995-1005.

Peter J. Basser et al., "Diffusion-tensor MRI: theory, experimental design and data analysis—a technical review", NMR in Biomedicine, vol. 15, No. 7-8, 2002, pp. 456-467.

O. Coulon et al., "Diffusion tensor magnetic resonance image regularization", Medical Image Analysis, vol. 8, No. 1, 2004, pp. 47-67.

Pierre Fillard et al., "Quantitative Analysis of White Matter Fiber Properties along Geodesic Paths", vol. 2879 of LNCS, Springer, Nov. 2003, pp. 16-23.

Derek K. Jones et al., "Spatial Normalization and Averaging of Diffusion Tensor MRI Data Sets", NeuroImage, vol. 17, 2002, pp. 592-617.

* cited by examiner

DEVICE FOR PROCESSING RAW IMAGES OR TENSOR IMAGES

BACKGROUND OF THE INVENTION

1. Field of the Invention

The invention relates to the field of imaging, and in particular the processing of raw images or tensor images.

2. Definitions

Before further discussion, a definition of the following terms will aid in the understanding of the present invention.

The terms used in this disclosure are defined as follows unless otherwise indicated. Standard terms are to be given their ordinary and customary meaning as understood by those of ordinary skill in the art, unless expressly defined herein.

The term "raw image" is taken here to mean an image supplied by an imager (or image capture device) in the form of vectors or symmetrical matrices (not necessarily defined as positive) and intended to allow or facilitate the production of a tensor image.

Furthermore, the term "tensor" is taken here to mean a matrix of n*n numbers which is symmetrical and defined as positive. The dimension n is generally equal to 2 in the case of two-dimensions (2D) or 3 in the case of three dimensions (3D), but the invention is not limited to these two values. It relates in fact to any value of n.

Furthermore, "tensor image" is taken here to mean an image represented by a set of tensors each associated with an elementary part of a two- or three-dimensional grid. In the case of a two-dimensional (2D) grid, each elementary part is called a "pixel", whereas in the case of a three-dimensional grid (3D) each elementary part is called a "voxel".

As the person skilled in the art knows, tensors are mathematical objects which are frequently used in the field of imaging. This is particularly the case in the field of medical imaging, e.g. in order to analyse diffusion tensor images obtained by magnetic resonance (technology known by the English acronym DT-MRI for "Diffusion Tensor Magnetic Resonance Imaging"—diffusion tensor imaging obtained by magnetic resonance, or written more simply as DTI for "Diffusion Tensor Imaging").

In general, "diffusion tensor" is taken to mean here the covariance matrix of a diffusion process at one point of a physical medium.

DISCUSSION OF BACKGROUND INFORMATION

Diffusion tensors are only one example of tensors from among other examples to which the invention applies. From these other tensors, one might mention two in particular which are used to model anatomical variations, to refine or adapt meshes of areas, surfaces or volumes or even to carry out statistics on results of failures.

In general, tensors are used in imaging in order to carry out processing by interpolation, extrapolation, segmentation, grouping, movement analysis or texture segmentation. Tensors are also used in other fields such as the mechanics of continuous media, e.g. in the case of the tensor of stresses.

In order to effect calculations with the objects known as tensors, a distance must be defined between tensors, which are better known as "metrics" and an associated operation framework. Since the space of the tensors forms part of the vectorial space of square matrices, it is therefore possible to use a Euclidian structure with square matrices in order to define a metric therein. This metric is easy to use and makes it possible a priori to carry out relatively simple calculations.

However, imaging experts realised that this Euclidian framework had faults, both in practical terms and in theory. They proposed, therefore, to use metrics known as Riemannian for the space of the tensors. By virtue of these Riemannian metrics, the space of the tensors is not limited; the zero eigenvalues were excluded to infinity, the symmetry between a tensor and its inverse is retained, and affine invariance is obtained. Consequently, the calculations are invariant relative to the affine changes of coordinates. This Riemannian framework is therefore particularly attractive in theory.

Supplementary data in the Riemannian field can be found in the paper by X Pennec et al. "A Riemannian framework for tensor computing", Research Report 5255, INRIA, July 2004 or in the paper by P T Fletcher et al. "Principle geodesic analysis on symmetric spaces: Statistics of diffusion tensors", Proc. of CVAMIA and MMBIA Workshops, Prague, Czech Republic, May 15, 2004, LNCS 3117, pages 87-98, Springer 2004, or in the paper by C Lenglet et al. "Statistics on multivariate normal statistics on multivariate normal distributions: A geometric approach and its application to diffusion tensor mri", Technical report, INRIA, June 2004.

Unfortunately, due to the curvature of this Riemann space, the Riemannian framework mentioned above requires the use of complex algorithms which are costly in computing time. It therefore proves ill-adapted to some situations, in particular to image (possibly tensor) capture apparatus or imagers operating virtually in real time and/or with a limited computing power, which is often the case of imagers for use in hospitals.

SUMMARY OF THE INVENTION

Since no known solution is entirely satisfactory, the object of the invention is to improve the situation by relying on another Riemannian framework, that of metrics known as "Log-Euclidian", both for processing initial tensor images and for processing raw initial images. In the following, "initial image" is taken to mean either a tensor image, or a raw image intended to allow or facilitate the production of a tensor image.

The invention proposes to this end a first device dedicated to the processing of data forming initial tensor images and includes (but is not limited to) a first computing unit, having the task of implementing a first selected function which is bijective and defined of the space R*+ in the space R, and which is associated with a selected metric definition, this first function admitting a second reciprocal function, and a first processing unit having the task of i) forming a first representation of a received tensor image, ii) of calling up the first computing unit in order to apply the first function to a selected part of the first representation, so as to obtain a transformed part and iii) of forming from the first transformed part a second representation of the tensor image which is capable of being processed.

The first device according to the invention may comprise other features which may be taken separately or in combination and in particular its first processing unit may have the task of i) forming each first representation in the form of a product of a first orthogonal matrix, of a diagonal matrix formed of coefficients and forming the selected part, and of a second orthogonal matrix, transposed from the first, ii) of calling up the first computing unit in order that it applies to each of the coefficients located on the diagonal of the diagonal matrix of the first selected function, so as to obtain a transformed diagonal matrix forming the transformed part, and iii) to obtain a product between the first orthogonal matrix, the transformed diagonal matrix and the second orthogonal matrix in order to supply a final symmetrical matrix which at least represents the second representation.

According to one aspect of the invention, the final symmetrical matrix can directly form the second representation. In a variant, the first processing unit may have the task of transforming the final symmetrical matrix of dimension n*n into a vector of dimension n(n+1)/2 which then forms the second representation.

Another aspect of the invention may also comprise a second processing unit having the task of applying at least one selected process to the second representation of the received tensor image in order to supply a third processed representation of the received tensor image; the second processing unit can then have the task of applying to at least one selected vectorial or matrix process to the second representation.

The invention may also comprise, on the one hand, a second computing unit having the task of implementing a second selected function, which is bijective and is associated with the selected metric definition, this second function being the reciprocal function of the first function, and on the other hand, a third processing unit having the task i) of forming a fourth representation of the received tensor image from the third representation, ii) of calling up the second computing unit in order to apply the second function to a selected part of the fourth representation in order to transform this part into a transformed part and iii) of forming a processed tensor image from the transformed part.

In the presence of a third representation in the vector form, the third processing unit may have the task i) of transforming this third representation into an intermediate symmetrical matrix of dimension n*n, ii) of breaking down the intermediate symmetrical matrix into a product of a third orthogonal matrix, of a diagonal matrix formed of coefficients and forming the selected part, and of a fourth orthogonal matrix transposed from the third, iii) of calling up the second computing unit in order to apply the second selected function to each of the coefficients located on the diagonal of this diagonal matrix in order to obtain a transformed diagonal matrix forming the transformed part, and iv) of effecting a product between the first orthogonal matrix, the transformed diagonal matrix and the second orthogonal matrix in order to supply the processed tensor image.

By way of modification, i.e. in the presence of a third representation in the form of an intermediate symmetrical matrix of dimension n*n, the third processing unit may have the task i) of breaking down the intermediate symmetrical matrix into a product of a third orthogonal matrix, of a diagonal matrix formed of coefficients and forming the selected part, and of a fourth orthogonal matrix transposed from the third, ii) of calling up the second computing unit in order to apply the second selected function to each of the coefficients located on the diagonal of this diagonal matrix in order to obtain a transformed diagonal matrix forming the transformed part, and iii) of effecting a product between the first orthogonal matrix, the transformed diagonal matrix and the second orthogonal matrix in order to supply the processed tensor image.

The first computing unit may have the task of applying a first function with a logarithmic base. For example, the first function with a logarithmic base is the Naperian logarithm function (log) which is associated with the second exponential reciprocal function (exp). By way of modification, the first function with a logarithmic base may be the logarithmic function with a base a ($\log_a$), where a≠e, which is associated with the second exponential reciprocal function with base a ($a^x = e^{x \log a}$).

The invention also proposes a second device dedicated to data processing forming a first processed representation of an initial (raw or tensor) image. This second device is characterised in that it includes (but is not limited to) a computing unit having the task of implementing a (second) selected function which is bijective and is associated with the definition of a selected metric, and a processing unit having the task i) of forming a second processed representation of the initial image from the first processed representation, ii) of calling up the computing unit to apply the (second) function to a selected part of the second processed representation so as to transform this part into a transformed part, and iii) of forming a processed tensor image from this transformed part.

The second device according to the invention may comprise other features which can be taken separately or in combination, in particular: in the presence of a first processed representation in the vector form, its processing unit may have the task of i) transforming the first processed representation into an intermediate symmetrical matrix of dimension n*n, ii) of breaking down this intermediate symmetrical matrix into a product of a first orthogonal matrix, of a diagonal matrix formed of coefficients and forming the selected part, and of a second orthogonal matrix transposed from the first, iii) of calling up the computing unit in order to apply the (second) selected function to each of the coefficients located on the diagonal of the diagonal matrix in order to obtain a transformed diagonal matrix forming the transformed part, then iv) of effecting a product between the first orthogonal matrix, the transformed diagonal matrix and the second orthogonal matrix in order to supply the processed tensor image.

By way of modification, i.e. in the presence of a first processed representation in the form of an intermediate symmetrical matrix of dimension n*n, the processing unit may have the task i) of breaking down the intermediate symmetrical matrix into a product of a first orthogonal matrix, of a diagonal matrix formed of coefficients and forming the selected part, and of a second orthogonal matrix which is transposed from the first, ii) of calling up the computing unit in order to apply the (second) selected function to each of the coefficients located on the diagonal of this diagonal matrix in order to obtain a transformed diagonal matrix forming the transformed part, and iii) of effecting a product between the first orthogonal matrix, the transformed diagonal matrix and the second orthogonal matrix in order to supply the processed tensor image.

The computing unit may have the task of applying a (second) selected base a exponential function. For example the (second) exponential function is the exponential function with base a=e which is the reciprocal of the (first) Naperian logarithm function (log). In a modification, the (second) exponential function can be the exponential function with base a≠e ($a^x = e^{x \log a}$) which is the reciprocal of the (first) logarithm function with base a ($\log_a$).

The first processed representation may arise from the application of at least one selected process to an intermediate representation (the second representation supplied by the first device) itself resulting from the application to a selected part of a previous representation (the first representation supplied by the first device) of an initial tensor image of another (first) selected function which is bijective and defined of the space R*+ in the space R, and is associated with the definition of the selected metric, this other (first) function being the reciprocal of the (second) function.

The invention may comprise a second processing unit having the task of applying at least one selected process to the data representing an initial raw image so as to supply the first processed representation. For example, the second processing unit may have the task of applying a selected vectorial process to the data representing the initial raw image.

The invention further proposes a dedicated process, just like the first device presented above, to the processing of data forming initial (raw or tensor) images. This process combines all the main and optional functionalities implemented by the first processing device and/or the second processing device.

The invention is particularly well adapted, albeit not exclusively, to the processing of initial (raw or tensor) images, in particular of diffusion, in the field of medicine.

BRIEF DESCRIPTION OF THE DRAWINGS

Other features and advantages of the invention will appear from a reading of the detailed description below and of the attached drawings, which show.

Figure 1:
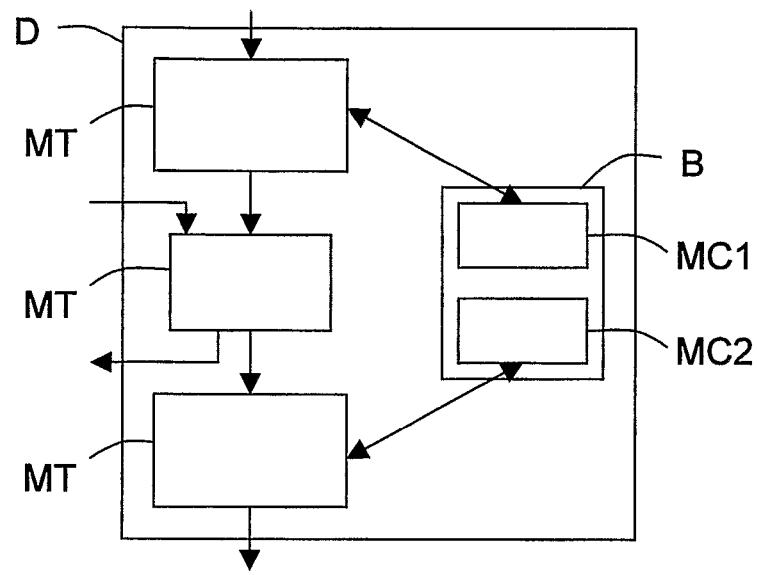
FIG. 1 shows in a very schematic and functional manner an embodiment of a first processing device according to the invention.

The attached drawings may not only supplement the invention but also contribute to its definition if necessary.

DETAILED DESCRIPTION OF THE PRESENT INVENTION

The invention is directed to the processing of initial raw or tensor images, possibly with noise. Any type of initial two- or three-dimensional image is concerned here, in particular medical images, e.g. of the DT-MRI type or elasticity tensors (making it possible for example to extract the Young's module at each point in order to classify tumours of different types), images of turbulences in fluid mechanics and images in the field of ultrasound, images of "metrics" (name for tensors used by the person skilled in the art in this case) used for example for refining or adapting meshes of areas, surfaces or volumes (in particular in order to speed up image processing relating to the digital resolution of equations with partial derivatives).

Furthermore, the invention relates to any type of initial (raw or tensor) image processing, in particular the filtering out of noise (possibly vectorial) so as to facilitate any type of subsequent complementary processing, interpolation or extrapolation (in order to reconstitute missing information from starting information, e.g. to obtain images of greater resolution in intermediate cuts), segmentation (e.g. in order to carry out classification of different components or regions or of different types of material), grouping, movement analysis, texture segmentation, modelling of variations (possibly anatomical ones), the reconstruction of connectivity of the white matter in the brain or cerebral connections, or obtaining statistics on results of failures (these statistics being usable subsequently as a starting point for anatomic variability).

The invention proposes to use a new Riemannian framework overcoming the disadvantages of the affine-invariant Riemannian framework. This new framework offers a space with zero curvature and a new metric which make it possible to reduce the complexity of the computations as it were at the Euclidian framework.

The theoretical data needed for the person skilled in the art to understand this new Riemannian framework are summarised below.

Each tensor S is associated with a unique logarithm L such as S=exp(L), where exp is the exponential of matrices. This logarithm is simply any symmetrical matrix, and conversely any symmetrical matrix corresponds to a unique tensor given by the exponential of that matrix. In an orthonormal base in which S is diagonal, L is obtained simply by transforming the eigenvalues of S into their standard logarithm, e.g. Naperian logarithm.

The theoretical framework in an application to the Naperian logarithm "log" and to its exponential reciprocal function "exp" is described below. In this application, the metric will be called "Log-Euclidian". However, this framework is not limited to the functions log and exp. It also applies to functions with a logarithmic base, and in particular to any base a logarithms and their reciprocals the any base a exponentials, as well as to other types of functions, such as for example the function "−log" or functions translated from any base a logarithms "C+/−$\log_a$", where C is a constant.

Since there exists a bijection between the space of the tensors, referenced Sym+(n), and that of the symmetrical matrices, referenced Sym(n), a vectorial space structure can be given to Sym+(n), by transporting the addition (+) and the scalar multiplication (·) with the exponential of matrices.

This defines on Sym**+(n) the logarithmic product $\odot$ and the scalar logarithmic multiplication $\circledast$ given by:

$$S_1 \odot S_2 := \exp(\log(S_1) + \log(S_2))$$

$$\lambda \circledast S := \exp(\lambda \cdot \log(S)) = S^\lambda$$

The logarithmic product is commutative and coincides with the matricial multiplication when the two tensors $S_1$ and $S_2$ commute in the direction of standard matricial multiplication.

With $\odot$ and $\circledast$ the space of the tensors has by construction a vectorial space structure. It may be noted that this structure is not the conventional structure arising from the addition and scalar multiplication defined usually on square matrices. With the latter, the space of the tensors is not a vectorial space, whereas with the logarithmic operations mentioned above, the space of the tensors is a vectorial space. The notion of vectorial space depends on the structure which is being considered and not directly on the space itself.

When only multiplication $\odot$ on the space of the tensors is being considered alone, what is known as a Lie group is obtained, i.e. a space which is both a differential variety and a group in which the algebraic operations are regular applications. This point of view is important, since the theory of Riemannian metrics can be used profitably in the case of Lie groups in order to define metrics, i.e. distances, in a framework where the conventional analysis tools and statistics may be generalised, as is indicated in the paper by X Pennec "Probabilities and Statistics on Riemannian Manifolds: A Geometric Approach", Research Report 5093, INRIA, January 2004.

From Riemannian metrics in Lie groups, the most practical, when they exist, are bi-invariant metrics, i.e. the distances which are invariant by multiplication and inversion. For the Lie group of tensors, these bi-invariant metrics exist and are particularly simple. As indicated above, they may be called Log-Euclidian, since they correspond to Euclidian metrics in the logarithmic field. Starting from a Euclidian norm $\|\cdot\|$ on Sym(n), they are written: $d(S_1, S_2) = \|\log(S_1) - \log(S_2)\|$. (1)

Contrary to the conventional Euclidian framework for tensors, it can be seen from the equation (1) that the symmetrical matrices with negative or zero eigenvalues are at infinite distance from the tensors and in practice do not appear in the calculations.

Moreover, the Log-Euclidian distances are invariant by inversion: the principle of symmetry between a tensor and its inverse is verified. Consequently, the mean tensor Log-Euclidian is a generalisation of the geometric mean and not of the arithmetic mean given by the conventional Euclidian framework. In particular, the mean Log-Euclidian of a tensor and its inverse is identity. This is crucial in particular in order to obtain a correct interpolation of the determinants when two tensors are interpolated.

From Log-Euclidian metrics in the space of tensors, some of these are invariant by similitude (rotation plus scale factor). This means that if the tensors are covariance matrices, the calculations made thereon with such a metric will be invariant if the system of coordinates is changed via a similitude. An example of an invariant metric by similitude is given by:

$$d(S_1, S_2) = (\text{Trace}(\{\log(S_1) - \log(S_2)\}^2))^{1/2}$$

The vectorial space of tensors equipped with a Log-Euclidian metric is isomorphic and isometric with the corresponding Euclidian space of symmetrical matrices. Consequently, the Riemannian framework for statistics and analysis is extremely simplified, even more so than in the case of affine-invariant metrics. In particular, the Log-Euclidian mean of N tensors is given by:

$$E_{LE}(S_1, \ldots, S_N) = \exp\left(\frac{1}{N} \sum_{i=1}^{N} \log(S_i)\right)$$

By virtue of this, interpolation, extrapolation, anisotropic diffusion, and more generally the different processes carried out on tensors can simply be carried out solely in the logarithmic field in a Euclidian manner and the final results can be transposed into the tensor field with the matrix exponential. In this manner, the conventional statistical or analytical tools (e.g. for statistics Analysis in Principal Components or APC and for analysis Equations with Partial Derivatives or EPDs) are generalised immediately to tensors. The existence and uniqueness of such EPDs on tensors lead back then to particular cases of the conventional theory of EPDs on fields of vectors.

In practice, it can be seen that Log-Euclidian and affine-invariant metrics give very close results in applications such as re-sampling, dense extrapolation of scattered data or anisotropic filtering. The main difference is in the slightly more marked anisotropy for the results obtained with a Log-Euclidian metric. On the other hand, there are considerable differences in terms of computation time and simplicity of implementation. In fact, the calculations made with a Log-Euclidian metric are quicker than those made with an affine-invariant metric by a factor at least equal to 6 in certain applications. Moreover, the calculations made with a Log-Euclidian metric are simple Euclidian calculations in the logarithmic field, and do not require curvature-type corrections as in the affine-invariant case.

The invention proposes a (first) device intended to process data forming initial tensor images, and in particular to facilitate their processing by one or more processing functions before one (or more) optional supplementary processes.

The term "facilitate" is used here to mean the fact of having a simple mathematical framework in which, for example, the statistics are simply statistics on vectors. From the perspective of analysis, this vectorial framework makes it possible to bring about a dependence between close tensors of a tensor image in a vectorial and therefore very simple manner, in order for example to reduce the noise which corrupts the images, whilst retaining the anisotropy data that they contain.

The (first) processing device D may form part of a tensor image capture apparatus (or imager) or may be embedded in a computer intended to process tensor images supplied by an imager.

EXAMPLES

It will be noted in the following, by way of illustrative example, that the device D receives DT-MRI-type tensor images each formed from raw images consisting of what is known as a base image and six acquired images following six different directions and representing here the diffusion of water molecules in these six directions for a same b-factor. The base image is an IRM T2 (magnetic resonance image) captured with the same parameters as the diffusion images (with a zero b-factor, this time). The process of diffusion involves a reduction in the signal in each of the diffusion images relative to the base image. This reduction depends directly on the diffusion tensor in each elementary part of the images.

Each tensor image is therefore formed of a set of tensors, each defined in a known elementary position part within a two- or three-dimensional grid. It should be remembered that a tensor is a real symmetrical positively defined matrix.

An embodiment which is schematic and functional of a (first) processing device D, according to the invention, is shown in FIG. 1.

This processing device D comprises at least one (first) computing unit MC1 coupled to a (first) processing unit MT1.

The first computing unit MC1 has the task of implementing a first selected bijective function of the space of the positive and non-zero reals numbers ($R^{*+}$) in the space of real numbers (R) (i.e. from [0, +∞[towards]−∞, +∞]), the function being associated with a metric of the type presented above in the framework of the theoretical summary of the new Riemannian framework (equation (1)). Furthermore, this first function must admit a second reciprocal function.

It is important to note that since the calculations are made by computers, −∞ and +∞ are respectively smaller and larger values than a computer can reach.

Furthermore, as the first and second functions are implemented by computers, they are ideal in the practice of approximations of functions. Consequently, first or second function is taken here to mean an approximation of a first or second ideal function. In the same way, "bijective function" is taken here to mean an ideally bijective or approximately bijective function.

Furthermore, "reciprocal function" is taken here to mean an ideally reciprocal or approximately reciprocal function.

For example, the first function selected is an approximation of an ideal function of the base a logarithm type (a function which transforms a product into a total). For example, a logarithm with base a=e (2.71828 . . . ) may be involved, known as a Naperian logarithm "log", which is associated with the (second) ideal reciprocal function known as Naperian exponential "exp". It could also involve a base a logarithm "$\log_a$", where a≠e, which is associated with the (second) ideal reciprocal function known as base a exponential "$a^x = e^{x \log a}$".

The progression from the Naperian logarithm to the base a logarithm (a≠e) only introduces a scale factor at the level of the given metric by the relation (1) $d(S_1, S_2) = \|\log(S_1) - \log(S_2)\|$, where $S_i$ (i=1, 2) represents a tensor and "log" represents the Naperian logarithm function applied to a matrix.

It is important to note that the invention is not limited to just the (first) logarithmic functions. It applies to any (first) selected function which is bijective and defined of the space R*+ in the space R, and is associated with a selected definition of metric.

It should be noted in the following that the first function, implemented by the first computing unit MC1, is the Naperian logarithm (log).

The first computing unit MC1 may for example form part of a mathematical library of operators and functions B.

The first processing unit MT1 has the task of performing three operations.

The first operation includes transforming each tensor image (initial, possibly with noise) which it receives into a first representation R1.

The second operation includes calling up the first computing unit MC1 in order to apply the first function (here "log") to a selected part of the first representation R1, allowing it thus to transform this selected part into a transformed part.

The third operation includes departing from the transformed part to form a second representation R2 of the received (initial) tensor image. This second representation R2 facilitates processing (e.g. noise filtering) by at least one processing function (e.g. of filtering) of the (initial) tensor image received due to its vectorial nature.

For example, during the first operation the first processing unit MT1 transforms each tensor image into a first representation R1 in the form of a product of a first orthogonal matrix $M_R$, of a diagonal matrix $M_D$ and of a second orthogonal matrix $M^t_R$, transposed from the first $M_R$. To this end, it is possible for example to use a LAPACK ("Linear Algebra Package"—set of routines in Fortran 77 for linear algebra) routine, such as DYSERV. This first representation may be rewritten: $R1 = M_R \cdot M_D \cdot M^t_{R1}$, where $$M_D = \begin{pmatrix} C_{11} & 0 & 0 \\ 0 & C_{22} & 0 \\ 0 & 0 & C_{33} \end{pmatrix}$$

a diagonal matrix of n*n numbers (here n=3) where the Cii (i=1 to 3) are coefficients located on the diagonal and where all the coefficients Cij (where i≠j) located outside the diagonal are zero.

It should be remembered that an orthogonal matrix $M_R$ is a matrix of n*n numbers, such as $M_R \cdot M^t_R = Id$ where Id is the identity matrix n*n, i.e. with coefficients equal to a1 on the diagonal and coefficients equal to zero elsewhere.

In this case, during the second operation, the first processing unit MT1 transforms the diagonal matrix $M_D$ (selected part) into a transformed diagonal matrix $M'_D$ (transformed part) by means of the first function (here "log") of the first computing unit MC1:

$$M'_D = \begin{pmatrix} \log(C_{11}) & 0 & 0 \\ 0 & \log(C_{22}) & 0 \\ 0 & 0 & \log(C_{33}) \end{pmatrix}$$

This amounts to applying the first function log to each coefficient Cii located on the diagonal of the matrix $M_D$.

Then, during the third operation, the first processing unit MT1 effects the product between the first orthogonal matrix $M_R$, the transformed diagonal matrix $M'_D$ and the second orthogonal matrix $M^t_R$ in order to supply a final symmetrical matrix $M_S$ (of n*n numbers) which represents (at least) the second representation R2. This final matrix $M_S$ is symmetrical but not defined as positive:

$$M_S = \begin{pmatrix} (\log C)_{11} & (\log C)_{12} & (\log C)_{13} \\ (\log C)_{12} & (\log C)_{22} & (\log C)_{23} \\ (\log C)_{13} & (\log C)_{23} & (\log C)_{33} \end{pmatrix}$$

If a matricial process (e.g. a matricial filtering function) is provided after obtaining the final symmetrical matrix $M_S$, this forms the second representation R2 of the (initial) tensor image received, ready to be processed (e.g. filtered). On the other hand, if a vectorial process (e.g. a vectorial filtering function) is provided after obtaining the final symmetrical matrix $M_S$, the processing unit MT1 proceeds to transform the final symmetrical matrix $M_S$ into a vector V of dimension n(n+1)/2, which then forms the second representation R2 of the (initial) tensor image received, ready to be filtered, given for example but not exclusively by:

$$V := (\log C)_{11}, (\log C)_{22}, (\log C)_{33}, \sqrt{2}*(\log C)_{12}, \sqrt{2}*(\log C)_{13}, \sqrt{2}*(\log C)_{23})^T \quad (2)$$

One can also use other variants, in particular all the linear, non-singular combinations of coefficients of the vector defined by the equation (2).

As is illustrated in FIG. 1, the processing device D may also comprise a second processing unit MT2 having the task of applying at least one selected processing function (e.g. filtering) to the second representation R2 (of the (initial) tensor image received), supplied by the first processing unit MT1.

Any type of matricial or vectorial processing may be envisaged according to whether the representation R2 is presented in the form of a final symmetrical matrix $M_S$ or a vector V. From the different matricial processes which can be envisaged, one might cite in particular all vectorial processes in which the matrices are treated as vectors or matricial processes presented in the paper by J Weickert et al. "Diffusion and Regularization of Vector- and Matrix-valued Images", Preprint no. 58, Universität des Saarlandes, Saarbrücken 2002. From among the different vectorial processes which may be envisaged, one might cite in particular the anisotropic filters presented in the article by Gerig et al. "Non-linear Anisotropic Filtering of MRI Data", IEEE Transactions in Medical Imaging, 11(2): 221-232, June 1992.

The second processing unit MT2 supplies as output a third representation R3, which is processed, of the (initial) tensor image received. This third representation R3 is presented in the form of a filtered matrix $M_F$ or of a filtered vector $V_F$, according to whether the second representation R2 is presented in the form of a final symmetrical matrix $M_S$ or of a vector V.

Figure 2:
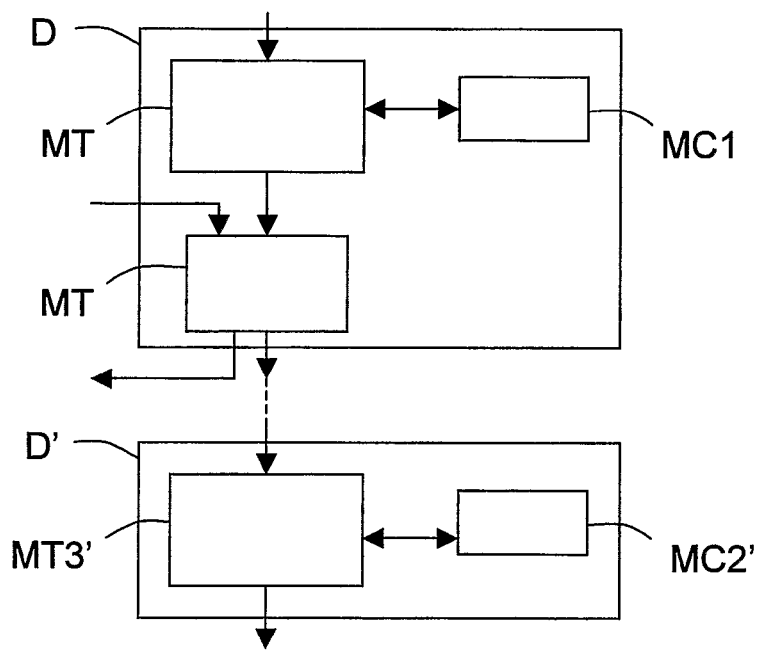
FIG. 2 shows in a very schematic and functional manner an embodiment of a second processing device according to the invention, supplied with a modification of the first processing device of FIG. 1.

As is illustrated in FIGS. 1 and 2, the second processing unit MT2 may comprise a supplementary input making it possible, for example, to guide the processes which it has the task of applying to the second representation R2.

By way of modification or in addition, and as is shown in FIGS. 1 and 2, the second processing unit MT2 may also comprise a supplementary output making it possible to supply different date of the third representations R3 (image of vectors or symmetrical matrices), but having a relation therewith. For example, it may supply data representing an image of numbers making it possible to distribute the voxels of an image into n classes.

In order to return to the initial format of the tensor image, which may be the subject of numerous known processes, the processing device D comprises a third processing unit MT3 coupled to a second computing unit MC2.

The second computing unit MC2 has the task of implementing the second function, which is reciprocal to the first function applied by the first computing unit MC1. Due to the properties of the first function, this second function is bijective and associated with the definition of selected metric.

As indicated above, when the first function is the Naperian logarithm "log", the second function is the Naperian exponential "exp".

The second computing unit MC2 may for example form part of a mathematical library of operators and functions B.

The third processing unit MT3 has the task of performing at least three operations.

The first operation includes forming a fourth representation R4 (processed) of the (initial) tensor image received, from the third representation R3 supplied by the second processing unit MT2.

The second operation includes calling up the second computing unit MC2 in order to apply the second function (here "exp") to a selected part of the fourth representation R4, permitting it thus to obtain a transformed part.

The third operation includes forming a processed tensor image from the transformed part.

For example, during the first operation the third processing unit MT3 transforms the filtered matrix $M_F$ (or R3) into a product of a third orthogonal matrix $M'_R$, of a filtered diagonal matrix $M_{DF}$ and of a fourth orthogonal matrix $M'^t_R$, transposed from the third $M'_R$, in order to obtain the fourth (processed) representation R4. To this end, it is possible for example to use a LAPACK routine, such as DYSERV. This fourth (processed) representation R4 may be rewritten: $R4 = M'_R \cdot M_{DF} \cdot M'^t_R$.

The filtered diagonal matrix $M_{DF}$ is given by:

$$M_{DF} = \begin{pmatrix} C'_{11} & 0 & 0 \\ 0 & C'_{22} & 0 \\ 0 & 0 & C'_{33} \end{pmatrix}.$$

where the coefficients $C'_{ii}$ are the eigenvalues of the filtered matrix $M_F$.

Obviously, when the third representation R3, supplied by the second processing unit MT2, is presented in the form of a filtered vector $V_F$ and not a filtered matrix $M_F$, the third processing unit MT3 transforms the filtered vector $V_F$ into an intermediate symmetrical matrix (or filtered matrix $M_F$) of dimension n*n.

In the abovementioned example, during the second operation the third processing unit MT3 transforms the filtered diagonal matrix $M_{DF}$ (selected part) into a filtered and transformed diagonal matrix $M'_{DF}$ (transformed part) by means of the second function (here "exp") of the second computing unit MC2:

$$M'_{DF} = \begin{pmatrix} e^{C'_{11}} & 0 & 0 \\ 0 & e^{C'_{22}} & 0 \\ 0 & 0 & e^{C'_{33}} \end{pmatrix}$$

This amounts to applying the second function exp to each coefficient $C'_{ii}$ located on the diagonal of the matrix $M_{DF}$.

Then, during the third operation, the third processing unit MT3 effects the product between the third orthogonal matrix $M'_R$, the transformed diagonal matrix $M'_{DF}$ and the fourth orthogonal matrix $M'^t_R$, in order to supply a processed tensor image ($M'_R \cdot M'_{DF} \cdot M'^t_R$).

This processed tensor image may then be the subject of numerous known supplementary processes, in particular and not exclusively when the processing carried out by the second processing unit MT2 includes of noise-removal by filtering. From the supplementary processes, one might mention for example interpolation, extrapolation, segmentation, grouping, movement analysis, texture segmentation, modelling of variations (possibly anatomical), detection of reconstruction of connectivities of the white matter in the brain or of cerebral connections, or obtaining statistics on the results of failures.

The invention also relates to a (second) processing device D' intended exclusively to bring back to the initial format of a tensor image data representing the third representation R3, supplied by the second processing unit MT2.

It is important to note that the (first) processing device D presented above may, in one modification, only have a first computing unit MC1 and first and second processing units MT1 and MT2, as is shown in FIG. 2. In this case, the second processing unit MT2 supplies data representing the third representation R3 which can be stored in order to receive supplementary processing making it possible to bring them back to the initial format of the tensor image that they represent.

In this case, it is necessary to provide a (second) processing device D' intended solely to bring back to the initial format of a tensor image data representing the third representation R3, supplied by the second processing unit MT2.

Such a (second) processing device D' is shown in FIG. 2 by way of example. It is in fact formed of a (second) computing unit MC2' and of a (third) processing unit MT3' respectively identical to the second computing unit MC2 and the third processing unit MT3 of the (first) processing unit D shown in FIG. 1. Since the functioning of these two units MC2' and MT3' is respectively identical to those of units MC2 and MT3, they will not be described again.

The (first) processing unit D, and in particular its computing unit MC1, its first processing unit MT1 and if they are present its second MT2 and third MT3 processing units and second computing unit MC2, on the one hand, and the (second) processing device D', and in particular its second computing unit MC2' and its third processing unit MT3' on the other hand, may be realised as electronic circuits, software (or IT) units, or a combination of circuits and software.

Some examples of processing which may be applied to initial tensor images by means of a first D or a second D' processing device are described below.

Figure 3:
FIG. 3 shows an image of four tensors in a made-up case.
Figures 4, 5:
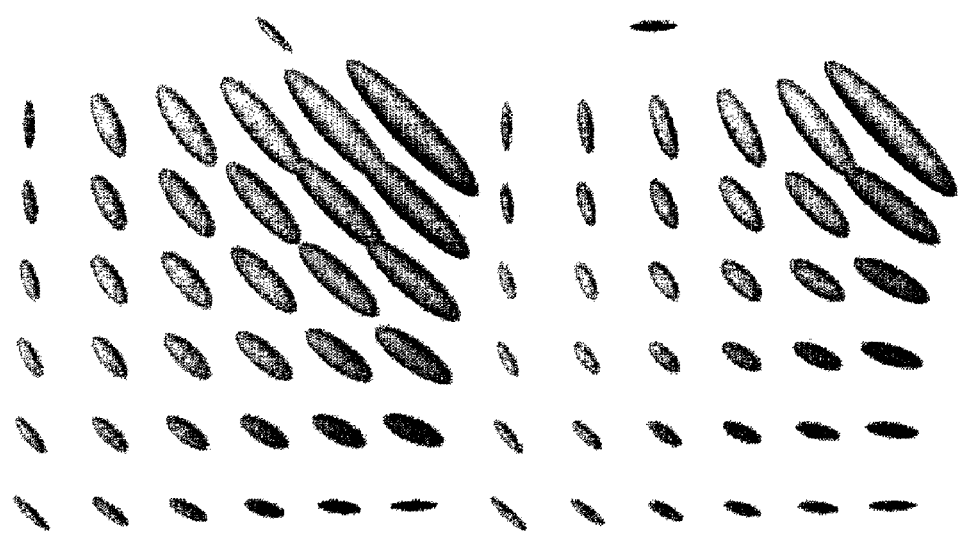
FIGS. 4 and 5 shows the results of a bilinear interpolation applied to the image of FIG. 3 in the presence of processes in the Euclidian framework and in the Log-Euclidian framework respectively.

In FIG. 3 is shown an image of four tensors in a made-up case, and in FIGS. 4 and 5 are the results of a bilinear interpolation applied to the image of FIG. 3 in the presence of processes respectively in the Euclidian framework and in the Log-Euclidian framework. As can be found, a pronounced enlargement effect appears in the Euclidian case (FIG. 4), contrary to the case of Log-Euclidian (FIG. 5).

Figure 6:
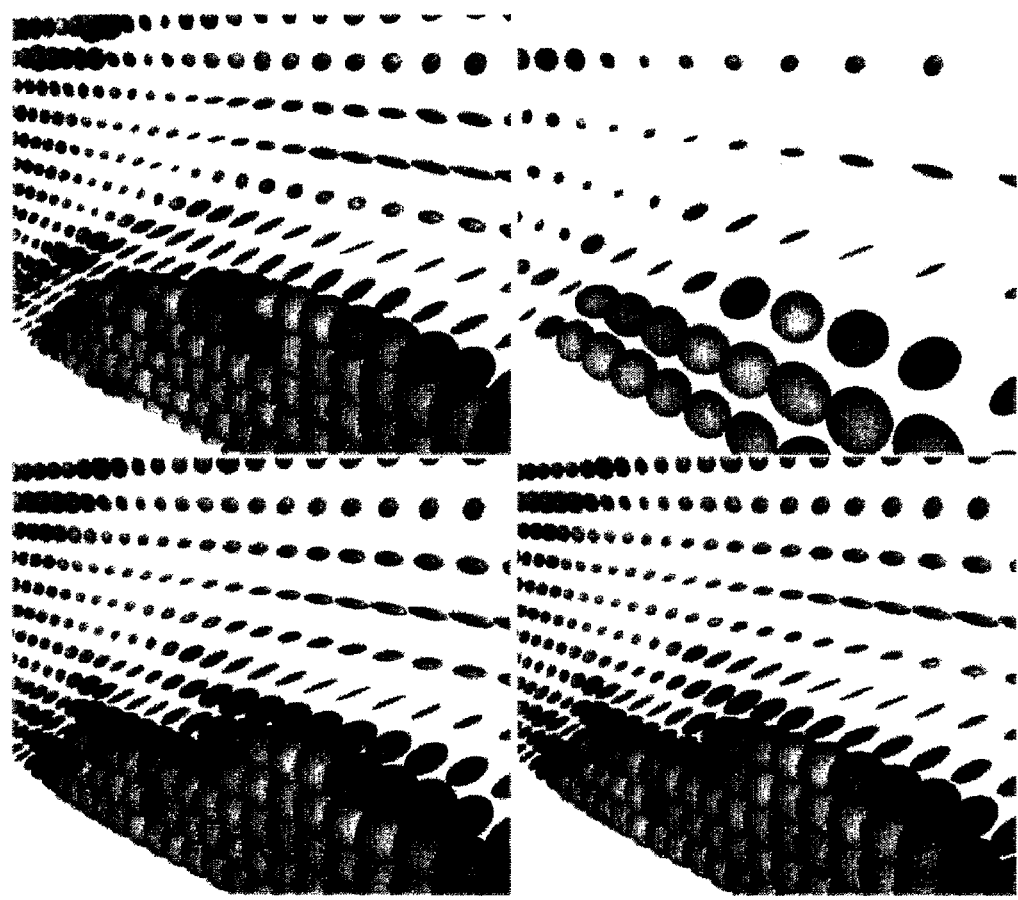
FIG. 6 shows the results of re-sampling by bilinear interpolation obtained respectively with Euclidian and Log-Euclidian metrics in the case of a cut of a corpus callosum obtained by the real DT-MRI technique.

Another example of interpolation is shown in FIG. 6. A DT-MRI cut is used located in the median sagittal plane of a human brain. This cut is presented in a perspective view. The corpus callosum and a part of the ventricles are visible. More precisely, the part located at the top left of FIG. 6 shows the initial cut, the part located at the top right of FIG. 6 shows the result of sub-sampling including redrawing every other line and every other column in the initial cut, and the parts located to the bottom left and bottom right of FIG. 6 show the results of re-sampling by bilinear interpolation obtained respectively with Euclidian and Log-Euclidian metrics.

It can be found that there is a reconstruction of the anisotropy which is significantly greater in the Log-Euclidian case, in particular in the line of tensors corresponding to the corpus callosum just above the ventricles. In other words, the preservation of the anisotropy is clearly greater in the Log-Euclidian case.

Figure 7:
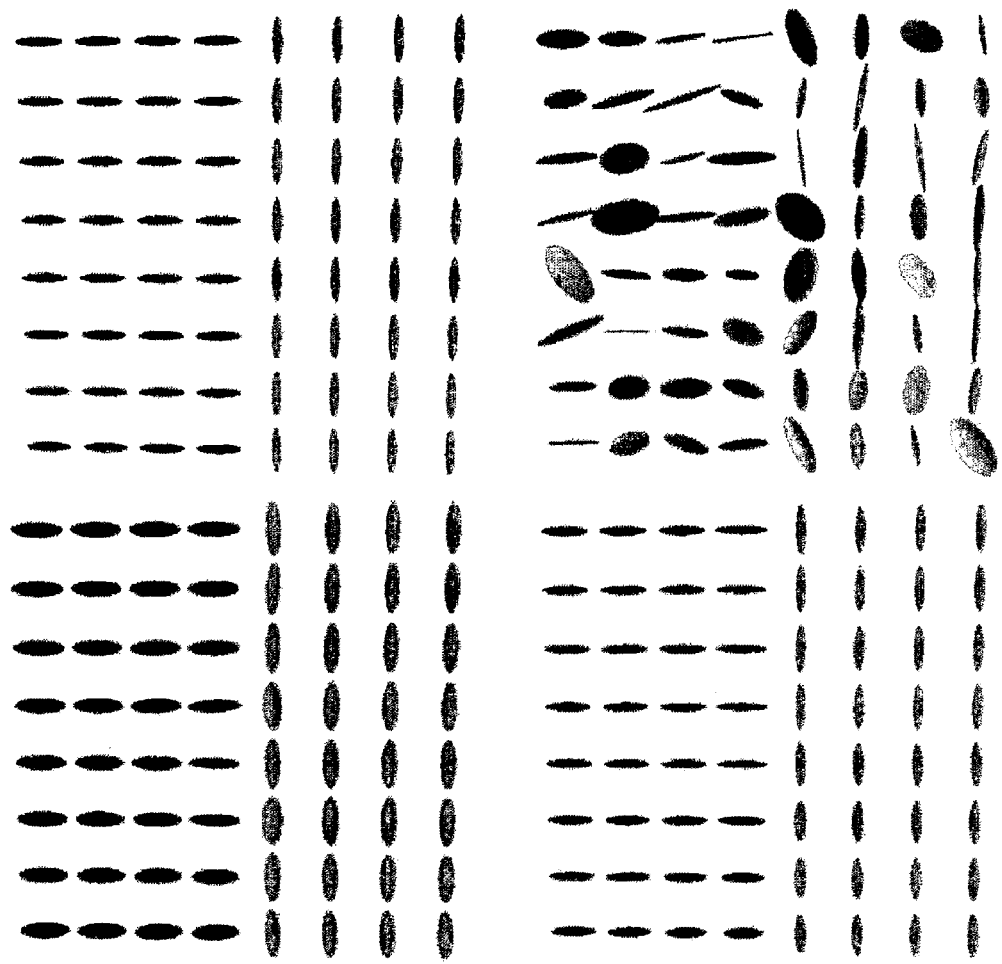
FIG. 7 shows the results of anisotropic filtering of a made-up image with noise obtained with Euclidian and Log-Euclidian metrics.

Another example corresponding to anisotropic filtering of an initial noisy made-up image is shown in FIG. 7. More precisely, the part located at the top left in FIG. 7 shows the initial non-noisy made-up image, the part located at the top right in FIG. 7 shows the initial noisy made-up image, and the parts located to the bottom left and bottom right of FIG. 7 show images filtered respectively with Euclidian and Log-Euclidian metrics.

More precisely, in this example, in the field of the image, an energy of regularity E(S) given by a $\phi$ function is minimised:

$$E(S) = \int_\Omega \Phi(\|\nabla S\|_{S(x)}(x)) \, dx$$

where $$\Phi(s) = \sqrt{\left(1 + \frac{s^2}{\kappa^2}\right)}$$

and S(x) is the field of tensors which is being filtered.

This regularity energy E(S) is minimised in the Euclidian and Log-Euclidian case with exactly the same parameters, notably a time rate dt=0.01 (standard explicit numeric diagram in the Log-Euclidian case, geodesic explicit numeric diagram in the Euclidian case), κ=0.05 and 1000 repeats. The conditions at the edges retained are homogenous Neumann conditions.

Again, an excellent reconstruction can be found of the initial image in the Log-Euclidian case and a typical swelling effect in the Euclidian case.

Figure 8:
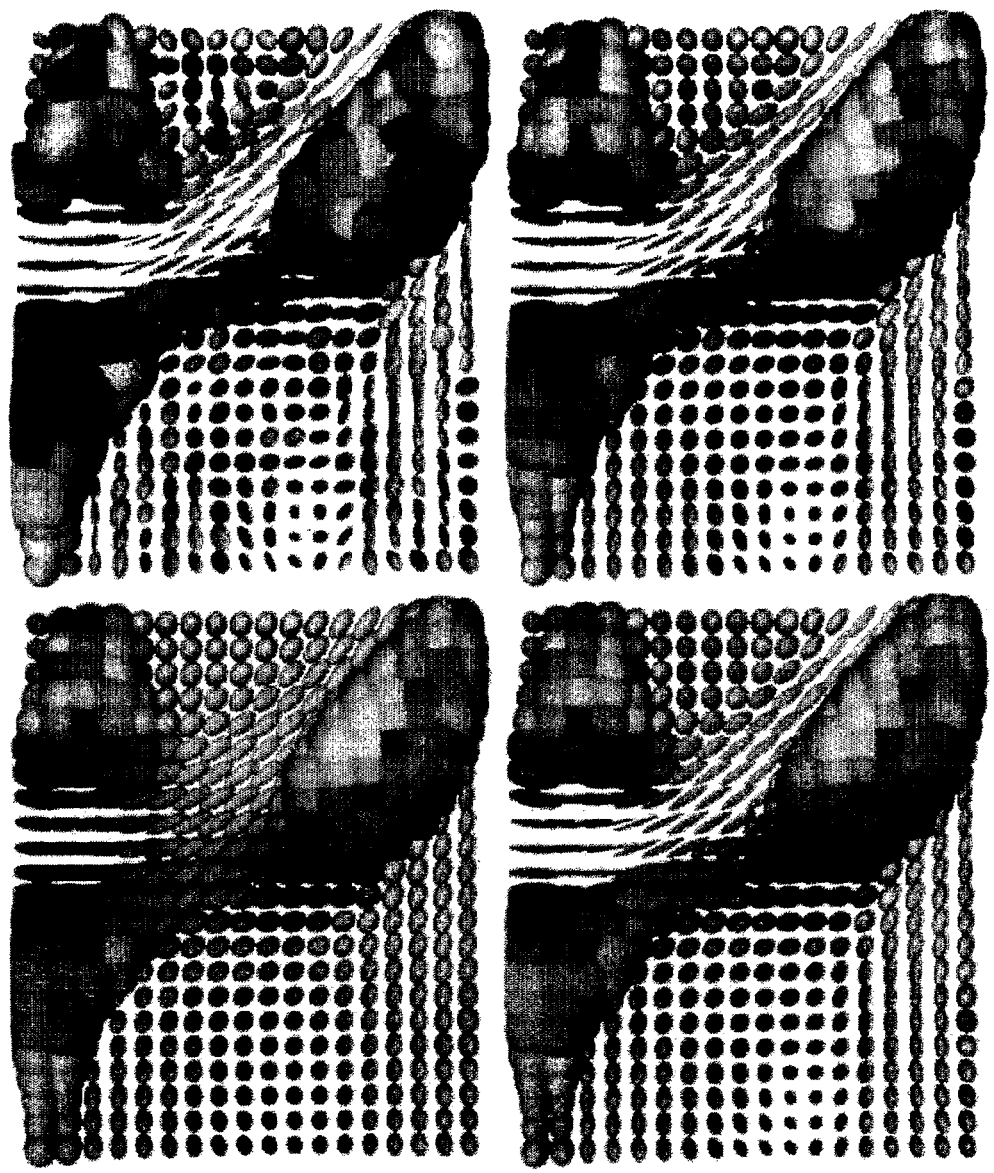
FIG. 8 shows the results of anisotropic filtering on a DT-MRI cut with Euclidian and Log-Euclidian metrics.

FIG. 8 shows the results obtained with this same anisotropic filter on a DT-MRI cut. More precisely, the part located at the top left of FIG. 8 shows the initial made-up image, the part at the top right of FIG. 8 shows the image filtered with the Log-Euclidian metric for 500 repeats, and the parts located at the bottom left and bottom right of FIG. 8 show images filtered respectively with the Euclidian and Log-Euclidian metrics for 1000 repeats.

Again, a marked swelling is found in the case of Euclidian and very satisfactory filtering in the case of Log-Euclidian, showing that the noise is attenuated whilst retaining the structures.

Figure 9A:
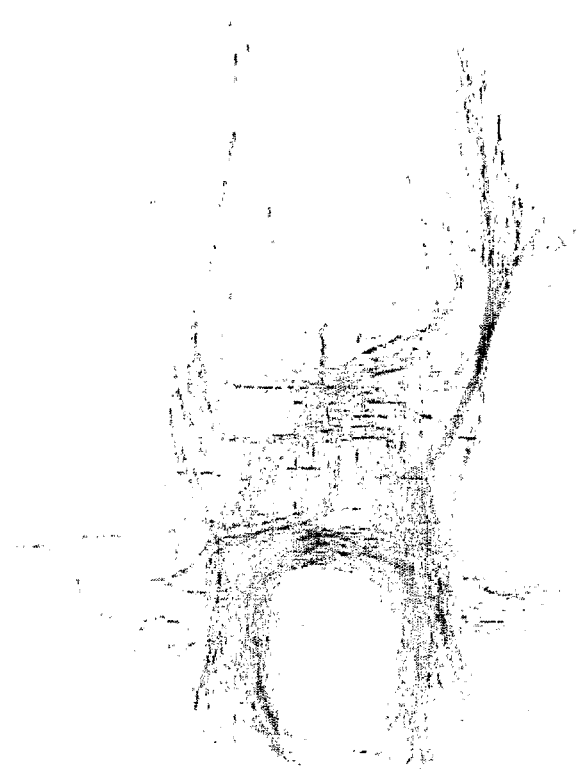
FIGS. 9A and 9B show the results of tracking of fibers in the white matter of the human brain respectively without prior processing and after processing (re-sampling and regularisation) with the Log-Euclidian metric.
Figure 9B:

FIGS. 9A and 9B show the results of the tracking of fibers in the white matter of the human brain respectively without pre-processing and after pre-processing (i.e. after filtering and isotropic re-sampling with the Log-Euclidian metric).

The tracking of fibers in the white matter of the brain from diffusion tensor images is a promising technique for mapping neuronal connections throughout the animal nervous system. Here an algorithm of fiber-tracking is used on a noisy image of diffusion tensors of size: 128*128*30 with, as spatial dimensions of voxel (3D): 1.875 mm*1.875 mm*4 mm. The diffusion process was sampled in 6 directions, with a b-factor of 1000. Furthermore, 100 repeats of the filtering described above were carried out, with dt=0.1 and κ=0.05.

As can be found, the reconstituted fibers are much more regular and numerous after pre-processing (FIG. 9B).

In the above, a second processing device D' was described, which was intended to bring back to the initial format of a tensor image data representing the third representation R3, supplied by the second processing unit MT2. However, the invention also proposes at least two variants (D" and D''') of the second processing device D'.

Figure 10:
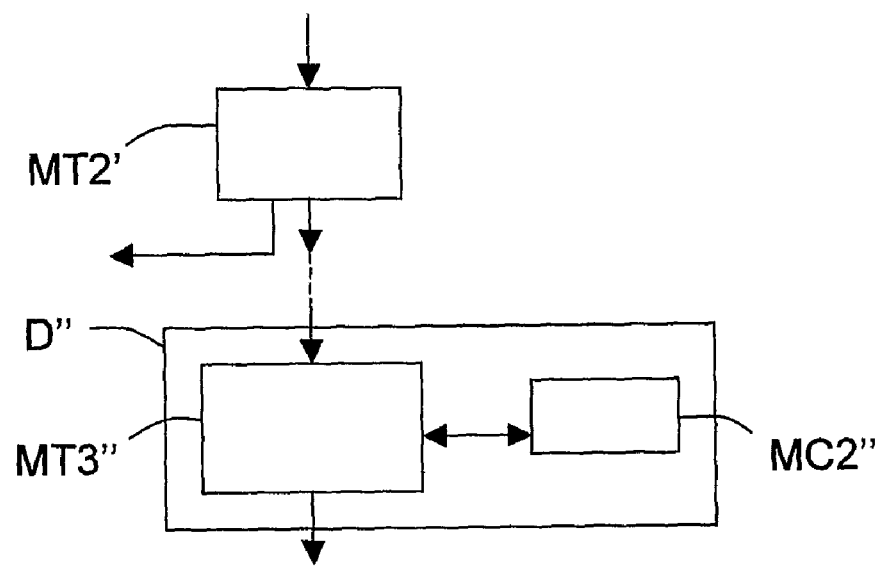
FIG. 10 shows in a very schematic and functional manner a first modification of a second processing device according to the invention.

A first variant D" is shown in FIG. 10 by way of illustrative and non-limiting example.

In this first variant, the second processing device D" receives from a second processing unit MT2' data representing a first processed representation R1' of an initial raw image.

The second processing unit MT2' is in this case intended to carry out one or more processes on initial raw data representing an initial raw vector image or initial symmetrical matrices (but not necessarily defined as positive) which do not come from a first processing device D according to the invention.

The data to be processed in this case come direct from an imager (or image capture device). These are not therefore data forming a second representation R2 resulting from the processing performed by the first processing unit MT1 on a first representation R1 of an initial tensor image.

For example, the second processing unit MT2' receives data representing raw diffusion images supplied by imagers.

The second processing unit MT2' may possibly (and as illustrated) comprise an additional output for supplying supplementary data, e.g. in the form of segmentation images, which are furthermore useful.

It is important to note that except for the origin of the data to be processed, the second processing unit MT2' is identical to the second processing unit MT2 described above with reference to FIGS. 1 and 2. Consequently, the processes which it can implement are identical to those which can be implemented by the second processing unit MT2.

For example, the second processing unit MT2' can process raw DT-MRI-type images in order to supply (third) representations intended to facilitate the estimation and coupled regularisation of tensor images (supplied by the second processing device D").

The intensity at each point x of a series of raw DT-MRI-type images $I_i$ (e.g. i=1 to 6) captured in spatial directions $u_i$ can be modelled from a base image $I_0$ according to the equation:

$$I_i(W(x)) = I_0(x) \cdot \exp(-bu_i T \cdot \exp(W(x)) \cdot u_i).$$

In this equation, W(x) is an image of symmetrical matrices which parameterises (i.e. represents implicitly) a tensor image which is sought, written $\Sigma(x) = \exp(W(x))$.

In practice, the ideal intensity $I_i(x)$ is not measured, but a noisy version $\hat{I}_i(x)$, and it is sought to minimise a reconstruction criterion which is given by the equation:

$$C(W) = \text{Sim}(W) + \% \text{Reg}(W),$$

formed of a term of attachment to the data (Ω being the field of the image):

$$\text{Sim}(W) = \sum_i \int_\Omega \text{dist}^2\bigl(I_i(W(x)), \hat{I}_i(x)\bigr) dx$$

and of a term of regularity Reg(W) given by a φ-function:

$$\text{Reg}(W) = \int_\Omega \phi(\|\nabla W(x)\|^2) dx$$

This criterion may then be used by numerous techniques for vectorial optimisation using the derivative or otherwise, as for example the techniques known as Gauss-Newton or Levenberg-Marquardt, or the Powell method.

When the optimisation method requires the derivative of the criterion, it is easy for the person skilled in the art to calculate this from the directional derivative of the matrix exponential. On the other hand, this is calculated a priori by means of a slowly converging series development. It is however possible to calculate this more efficiently with an explicit algorithm only applying diagonalisation, as for the process carried out by the first processing unit MT1: if W=R·S·RT, then $\partial_v \exp(W) = R \cdot (\partial R^T \cdot_{V \cdot R} \exp(S)) \cdot R^T$. In this formula, the components of the directional derivative according to Z of the exponential of a diagonal matrix $S = \text{Diag}(s_1, \ldots s_n)$ are given explicitly by the equation:

$$[\partial_z \exp(S)]_{ij} = \frac{\exp(s_i) - \exp(s_j)}{s_i - s_j} \cdot Z_{ij}.$$

This makes it possible to save computing time and gain numerical precision.

The distance between intensities used in the term of attachment to the data Sim(W) is usually selected from the form $\text{dist}^2(I, J) = (\log(I) - \log(J))^2$ since the optimisation of the criterion leads in the absence of regularisation (i.e. when λ=0) to an explicit solution of the tensor image sought Σ(x)=exp(W(x)). With prior techniques, the addition of a spatial regularity term leads to a problem of difficult optimisation since the vectorial methods do not guarantee that the eigenvalues of the tensor sought Σ(x) remain positive.

The use of the (second) function of the (second) computing unit MC2", by the third processing unit MT3" of the second processing device D", in order to parameterise the tensor image sought Σ(x) in this case makes it possible to formulate the problem of optimisation directly in a vectorial space and transforms this difficult problem into a simple problem, since any type of vectorial estimation method can be used. Moreover, by virtue of the invention, it is now possible to use a distance between intensities of the type $\text{dist}^2(I, J) = (I-J)^2$, which is adapted to real noise on images of the IRM type (which is approximately Gaussian), which was not the case before.

Once the second processing unit MT2' has performed its processing (here the estimation from raw DT-MRI-type images), the second processing device D" is used to transform the result of this processing ((third) processed representation (processed vector image or processed symmetrical matrices)) into a tensor image. This transformation is identical to that presented above.

It should be noted that this transformation is carried out by the (third) processing unit MT3" (identical to MT3 or MT3') and that it consists, in the first place, of forming another processed representation of the initial image from the processed representation, supplied by the second processing unit MT2', in the second place of calling up the (second) computing unit MC2" (identical to MC2 or MC2') in order to apply the (second) function to a selected part of the other representation, in order to transform this part into a transformed part, and in the third place of forming from the transformed part a processed tensor image.

To enhance understanding of the invention, an analogy can be used with Fourier transforms of a scalar image. The tensorial representation (tensor image) corresponds in fact to the spatial representation of the scalar image, and the vectorial representation by means of a (first) function, e.g. of the logarithm type, corresponds to the frequential representation of the scalar image. According to this analogy, the first processing device D processes the spatial representation of an initial scalar image by converting it into the field of frequencies by means of its first processing unit MT1 and of its (first) computing unit MC1, the second processing unit MT2 then carrying out one or more processes on the frequential representation of the scalar image, and the third processing unit MT3 (or MT3') and the (second) computing unit MC2 (or MC2') converting the processed frequential representation back into a processed spatial representation of the scalar image (tensor image, still by analogy).

When the initial scalar image is of the frequential type, the second processing unit MT2' is used directly to apply thereto one or more processes, and the second processing device D" (i.e. the third processing unit MT3" and the (second) computing unit MC2") converts back the frequential representation of the scalar image processed by the second processing unit MT2' into a processed spatial representation of the scalar image (tensor image), still by analogy. This is particularly useful in the case of tensors when estimation of a tensor image (possibly of diffusion) has to be carried out directly from raw data which are not tensor images, but vector images (or symmetrical matrices) and which are therefore not capable of undergoing a previous conversion (tensor/vector or tensor/symmetrical matrix) of the type carried out by the first processing unit MT1.

Figure 11:
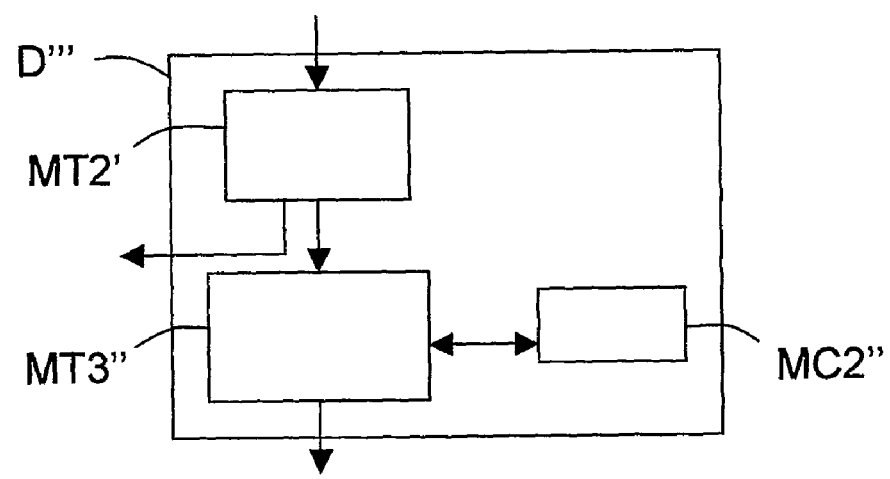
FIG. 11 shows in a very schematic and functional manner a second modification of a second processing device according to the invention.

It is important to note that a variant D''' of the second processing device D" presented above is conceivable, incorporating the second processing unit MT2'. Such a variant is shown schematically and functionally by way of non-limiting example in FIG. 11.

The variants of the second processing device D" and D''' and in particular their (second) computing unit MC2" and their (third) processing unit MT3", and their optional (second) processing unit MT2', can be realised as electronic circuits, software (or IT) units or a combination of circuits and software.

The invention can also be considered in the form of a process of initial (raw or tensor) image data processing.

This can be implemented by (first D and second D', D" or D''') the processing devices presented above. Since the main and optional functions and sub-functions carried out by the stages of this process are substantially identical to those carried out by the different means forming the devices D and D', D" or D''', only those stages will be summarised below which implement the main functions of the process according to the invention.

This process includes, but is not limited to, (in the case of an application to initial tensor images) a first stage in which a first representation R1 of a received tensor image is formed, a second stage in which a first selected function, which is bijective and defined of the space R*+ in the space R and associated with a selected metric definition, is applied to a selected part of the first representation R1, this first function admitting a second reciprocal function so as to obtain a transformed part, and a third stage in which, from the transformed part, a second representation R2 of the tensor image is formed which is ready to be processed by filtering.

These three first stages can be followed by a fourth stage of processing (optionally by filtering) leading to a third representation R3 of the tensor image, then by a fifth stage in which a fourth representation R4 of the tensor image is formed from the third representation R3, a sixth stage in which a second selected function which is bijective and associated with the selected metric definition is applied to a selected part of this fourth representation R4, this second function being the reciprocal function of the first function in order to obtain from this part a transformed part, and a seventh stage in which a processed tensor image is formed from the transformed part.

The invention is not limited to the embodiments of processing devices and processing method described above solely by way of example, but also embraces all the variants which the person skilled in the art may envisage within the scope of the claims below.

The invention claimed is:

1. A device for processing images forming initial tensor images, comprising:
a first computing unit configured to implement a first selected function, which is bijective and is defined as the space R*+ in space R, the first selected function admitting a second reciprocal function; and
a first processing unit coupled to the first computing unit and configured to form a first representation of a received tensor image, to invoke the first computing unit to apply the first function from a selected part of the first representation, to obtain a transformed part, and to form from the first transformed part a second representation of the tensor image adapted to a subsequent image processing,
wherein each tensor is a real symmetrical matrix which is defined as positive and represents an elementary part of a received tensor image,
wherein the first selection function is associated with a selected metric of type log-euclidian,
wherein the first processing unit is further configured to form each first representation as a product of a first orthogonal matrix, a diagonal matrix having coefficients, and a second orthogonal matrix transposed from the first orthogonal matrix,
wherein the first processing unit is configured to invoke the first computing unit so that the first computing unit applies the first selected function to each of the coefficients located on the diagonal of the diagonal matrix to obtain a transformed diagonal matrix forming the transformed part,
wherein the first processing unit is configured to produce a final symmetrical matrix at least representing the second representation from a product of the first orthogonal matrix, the transformed diagonal matrix, and the second orthogonal matrix, and
wherein the diagonal matrix forms the selected part of the first representation.

2. The device according to claim 1, wherein the final symmetrical matrix forms the second representation.

3. The device according to claim 1, wherein the first processing unit is configured to transform a final symmetrical matrix of dimension n*n into a vector of dimension n(n+1)/2 forming the second representation.

4. The device according to claim 1, further comprising:
a second processing unit configured to apply at least one selected process to the second representation of the received tensor image to supply a third processed representation of the received tensor image.

5. The device according to claim 3, wherein the second processing unit is configured to apply a selected vectorial process to the second representation.

6. The device according to claim 4, further comprising:
a second computing unit configured to implement a second selected function which is bijective and is associated with the selected metric definition, the second reciprocal function being the reciprocal function of the first function; and
a third processing unit configured to form a fourth representation of the received tensor image from the third representation, and to invoke the second computing unit in order to apply the second function to a selected part of the fourth representation to obtain a transformed part, and to form a processed tensor image from the transformed part.

7. The device according to claim 6,
wherein the third processing unit is configured to transform a third representation in vectorial form into an intermediate symmetrical matrix of dimension n*n,
wherein the third processing unit is configured to deconstruct the intermediate symmetrical matrix into a product of a third orthogonal matrix, a diagonal matrix having coefficients, and a fourth orthogonal matrix transposed from the third orthogonal matrix,
wherein the third processing unit is configured to invoke the second computing unit in order to apply to each of the coefficients located on the diagonal of the diagonal matrix the second selected function, to obtain a transformed diagonal matrix forming the transformed part,
wherein the third processing unit is configured to produce the processed tensor image from product of the first orthogonal matrix, the transformed diagonal matrix and the second orthogonal matrix, and
wherein the diagonal matrix forms the selected part of the fourth representation.

8. The device according to claim 6,
wherein the third representation is in the form of an intermediate symmetrical matrix of dimension n*n,
wherein the third processing unit is configured to deconstruct the intermediate symmetrical matrix into a product of a third orthogonal matrix, a diagonal matrix having coefficients, and a fourth orthogonal matrix transposed from the third orthogonal matrix,
wherein the third processing unit is configured to invoke the second computing unit to apply to each of the coefficients located on the diagonal of the diagonal matrix the second selected function, to obtain a transformed diagonal matrix forming the transformed part,
wherein the third processing unit is configured to produce the processed tensor image from a product of the first orthogonal matrix, the transformed diagonal matrix and the second orthogonal matrix, and
wherein the diagonal matrix forms the selected part of the fourth representation.

9. The device according to claim 1, wherein the first selected function has a logarithmic base, and the first computing unit is configured to apply the first selected function.

10. The device according to claim 9, wherein the first function with a logarithmic base is the Naperian logarithm function (log) which is associated with the second exponential reciprocal Naperian function (exp).

11. The device according to claim 9, wherein the first function with a logarithmic base is the base a logarithm ($\log_s$), and
wherein a≠e in the second exponential reciprocal function $a^x = e^{x \log a}$.

12. A device for processing data forming a first processed representation of an initial image, comprising:
a computing unit configured to implement a selected function which is bijective and associated with a selected metric definition; and
a processing unit coupled to the computing unit and configured to form a second processed representation of the initial image from the first processed representation, to invoke the computing unit to apply the function to a selected part of the second representation, to transform the selected part into a transformed part, and to form a processed tensor image from the transformed part,
wherein the processing unit is configured to transform a first processed representation in vectorial form into an intermediate symmetrical matrix of dimension n*n, and
wherein the processing unit is configured to deconstruct the intermediate symmetrical matrix into a product of a first orthogonal matrix, a diagonal matrix formed of coefficients, and a second orthogonal matrix transposed from the first orthogonal matrix,
wherein the processing unit is configured to invoke the computing unit in order to apply the selected function to each of the coefficients located on the diagonal of the diagonal matrix, to obtain a transformed diagonal matrix forming the transformed part, and
wherein the processing unit is configured to produce the processed tensor image from a product of the first orthogonal matrix, the transformed diagonal matrix and the second orthogonal matrix, and
wherein the diagonal matrix forms the selected part of the second representation.

13. The device according to claim 12,
wherein a first processed representation is in the form of an intermediate symmetrical matrix of dimension n*n, and
wherein the processing unit is configured to deconstruct the intermediate symmetrical matrix into a product of a first orthogonal matrix, a diagonal matrix having coefficients, and of a second orthogonal matrix transposed from the first orthogonal matrix,
wherein the processing unit is configured to invoke the computing unit in order to apply the selected function to each of the coefficients located on the diagonal of the diagonal matrix, to obtain a transformed diagonal matrix forming the transformed part,
wherein the processing unit is configured to produce the processed tensor image from a product between the first orthogonal matrix, the transformed diagonal matrix and the second orthogonal matrix, and
wherein the diagonal matrix forms the selected part of the second representation.

14. The device according to claim 12, wherein in that the computing unit is configured to apply a selected base a exponential function.

15. The device according to claim 14, wherein the exponential function is the exponential function of base a=e which is the reciprocal of the Naperian logarithm function (log).

16. The device according to claim 14, wherein a≠e in the exponential function is $a^x = e^{x \log a}$.

17. The device according to claim 12, wherein the first processed representation is a result of the application of at least one selected process to an intermediate representation arising from the application to a selected part of a previous representation of an initial tensor image of a second selected function which is bijective and defined of the space $R^{*+}$ in the space R, the second selection function being the reciprocal of the function implemented by the computing unit, and
wherein the second selected function is associated with the selected metric definition.

18. The device according to claim 12, further comprising
a second processing unit configured to apply at least one selected process to the data representing an initial raw image to supply the first processed representation.

19. The device according to claim 18, wherein the second processing unit is configured to apply a selected vectorial process to the data representing the initial raw image.

20. A method of processing data forming initial tensor images comprising:
forming a first representation of a received tensor image;
applying a first selected function which is bijective, defined as the space $R^{*+}$ in the space R, and associated with the selected metric definition to a selected part of the first representation, wherein the first function admits a second reciprocal function to obtain a transformed part, wherein the first selected function is associated with a selected metric of type log-euclidian,
forming a second representation of the tensor image from the transformed part, wherein each tensor is a real symmetrical matrix which is defined as positive and represents an elementary part of a received tensor image,
forming a first representation from a product of a first orthogonal matrix, a diagonal matrix having coefficients, and a second orthogonal matrix transposed from the first orthogonal matrix;
applying the first selected function to each of the coefficients located on the diagonal of the diagonal matrix to obtain a transformed diagonal matrix forming the transformed part; and
producing a final symmetrical matrix at least representing the second representation from a product of the first orthogonal matrix, the transformed diagonal matrix and the second orthogonal matrix, and
wherein the diagonal matrix forms the selected part of the first representation.

21. The method according to claim 20, wherein the final symmetrical matrix forms the second representation.

22. The method according to claim 20, wherein a final symmetrical matrix of dimension n*n is transformed into a vector of dimension n(n+1)/2 forming the second representation.

23. The method according to claim 20, wherein at least one selected process is applied to the second representation of the received tensor image to obtain a third processed representation of the received tensor image.

24. The method according to claim 22, wherein a selected vectorial process is applied to the second representation.

25. The method according to claim 23, further comprising:
forming a fourth representation of the received tensor image from the third representation;
applying a second selected function to a selected part of the fourth representation which function is bijective, the second selected function being associated with the selected metric definition to obtain a second transformed part; and
forming a processed tensor image from the second transformed part.

26. The method according to claim 25, further comprising:

transforming a third representation in vectorial form into an intermediate symmetrical matrix of dimension n*n;

deconstructing the intermediate symmetrical matrix into a product of a third orthogonal matrix, a diagonal matrix having coefficients, and a fourth orthogonal matrix transposed from the third orthogonal matrix; and producing the processed tensor image from the product of the first orthogonal matrix, the transformed diagonal matrix, and the second orthogonal matrix, wherein each of the coefficients located on the diagonal of the diagonal matrix, the second selected function is applied to obtain a transformed diagonal matrix forming the transformed part, and wherein the diagonal matrix forms the selected part of the fourth representation.

27. The method according to claim 25, further comprising deconstructing the intermediate symmetrical matrix into a product of a third orthogonal matrix, a diagonal matrix having coefficients, and of a fourth orthogonal matrix, transposed from the third orthogonal matrix, wherein to each of the coefficients located on the diagonal of the diagonal matrix, the second selected function is applied to obtain a transformed diagonal matrix forming the transformed part, and producing the processed tensor image from a product of the first orthogonal matrix, the transformed diagonal matrix, and the second orthogonal matrix, wherein the third representation is in the form of an intermediate symmetrical matrix of dimension n*n, and wherein the diagonal matrix forms the selected part of the fourth representation.

28. The method according to claim 20, wherein a first function with a logarithmic base is applied.

29. The method according to claim 28, wherein the first function with a logarithmic base is the Naperian logarithm function (log) which is associated with the second Naperian exponential reciprocal function (exp).

30. The method according to claim 28, wherein the first function with a logarithmic base is the base a logarithm function (loga), and wherein $a \neq e$ in the second base a exponential reciprocal function $a^x = e^{x \log a}$.

* * * * *